(12) United States Patent
Hayakawa et al.

(10) Patent No.: US 8,012,258 B2
(45) Date of Patent: Sep. 6, 2011

(54) MELT SURFACE POSITION MONITORING APPARATUS IN SILICON SINGLE CRYSTAL GROWTH PROCESS

(75) Inventors: Hiroshi Hayakawa, Tokyo (JP); Tokuji Maeda, Tokyo (JP)

(73) Assignee: Sumco Corporation, Tokyo (JP)

( * ) Notice: Subject to any disclaimer, the term of this patent is extended or adjusted under 35 U.S.C. 154(b) by 1138 days.

(21) Appl. No.: 11/802,792

(22) Filed: May 25, 2007

(65) Prior Publication Data

US 2007/0277727 A1    Dec. 6, 2007

(30) Foreign Application Priority Data

May 30, 2006  (JP) .................................. 2006-149890

(51) Int. Cl.
  *C30B 15/00*     (2006.01)
(52) U.S. Cl. ........ 117/202; 117/200; 117/201; 117/203; 117/206; 117/208; 117/218; 117/13; 117/14; 117/15
(58) Field of Classification Search .......... 117/200–220, 117/13, 14, 15
  See application file for complete search history.

(56) References Cited

U.S. PATENT DOCUMENTS

| | | | |
|---|---|---|---|
| 5,437,242 A * | 8/1995 | Hofstetter et al. | 117/14 |
| 6,171,391 B1 * | 1/2001 | Fuerhoff et al. | 117/14 |
| 6,454,851 B1 * | 9/2002 | Fuerhoff et al. | 117/15 |
| 6,464,777 B2 * | 10/2002 | Kitamura et al. | 117/13 |
| 7,033,070 B2 * | 4/2006 | Azami | 374/131 |
| 7,209,857 B2 * | 4/2007 | Sato et al. | 702/155 |
| 7,335,257 B2 * | 2/2008 | Jensen et al. | 117/49 |
| 7,339,235 B1 * | 3/2008 | Yamazaki et al. | 257/345 |
| 7,758,696 B2 * | 7/2010 | Stoddard et al. | 117/52 |
| 2001/0001944 A1 * | 5/2001 | Kitamura et al. | 117/13 |
| 2003/0023402 A1 * | 1/2003 | Kobayashi et al. | 702/167 |
| 2003/0142722 A1 * | 7/2003 | Azami | 374/120 |
| 2005/0016443 A1 * | 1/2005 | Lu et al. | 117/14 |
| 2006/0027160 A1 * | 2/2006 | Suzuki et al. | 117/38 |
| 2007/0017433 A1 * | 1/2007 | Sakurada et al. | 117/13 |
| 2007/0277727 A1 * | 12/2007 | Hayakawa et al. | 117/14 |
| 2009/0116019 A1 * | 5/2009 | Stoddard et al. | 356/445 |
| 2010/0024717 A1 * | 2/2010 | Orschel et al. | 117/15 |
| 2010/0024718 A1 * | 2/2010 | Orschel et al. | 117/15 |

FOREIGN PATENT DOCUMENTS

| | | |
|---|---|---|
| EP | 536 405 A1 | 4/1993 |
| EP | 588 355 A1 | 3/1994 |
| EP | 1 162 291 A1 | 12/2001 |
| EP | 1 279 752 | 1/2003 |
| JP | 63-281022 | 11/1988 |

* cited by examiner

*Primary Examiner* — Matthew J Song
(74) *Attorney, Agent, or Firm* — Clark & Brody

(57) ABSTRACT

The liquid surface position of the melt in the crucible in the silicon single crystal growth process utilizing the Czochralski method is monitored using the melt surface position on the occasion of seeding as a reference position and an estimated melt surface position can be calculated according to every situation, so that the distance between the melt and the thermal shield or water-cooling structure can be controlled with high precision. When the estimated melt surface position passes a preset upper limit and approaches the thermal shield, an alarm goes off and, further, when the melt comes into contact with the thermal shield or approaches the water-cooling structure, an alarm goes off if desired and, at the same time, the crucible is forcedly stopped from moving, so that a serious accident such as steam-incurred explosion resulting from the melt coming into contact with the water-cooling structure can be prevented. Accordingly, the apparatus can be widely applied as a melt surface position monitoring apparatus making it possible to safely operate any silicon single crystal growth apparatus utilizing the Czochralski method.

8 Claims, 8 Drawing Sheets

FIG.7A
FIG.7B
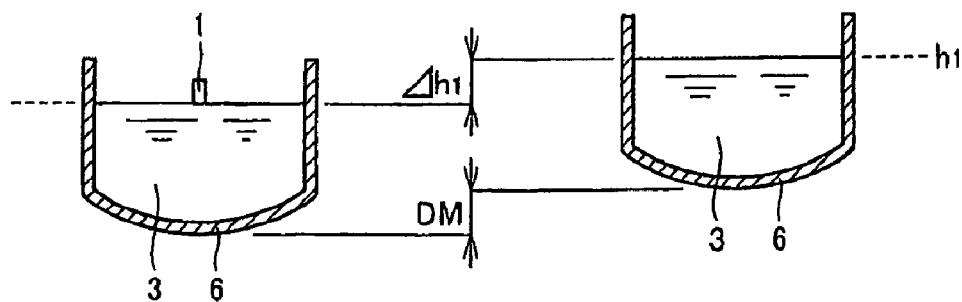
FIG.8A
FIG.8B
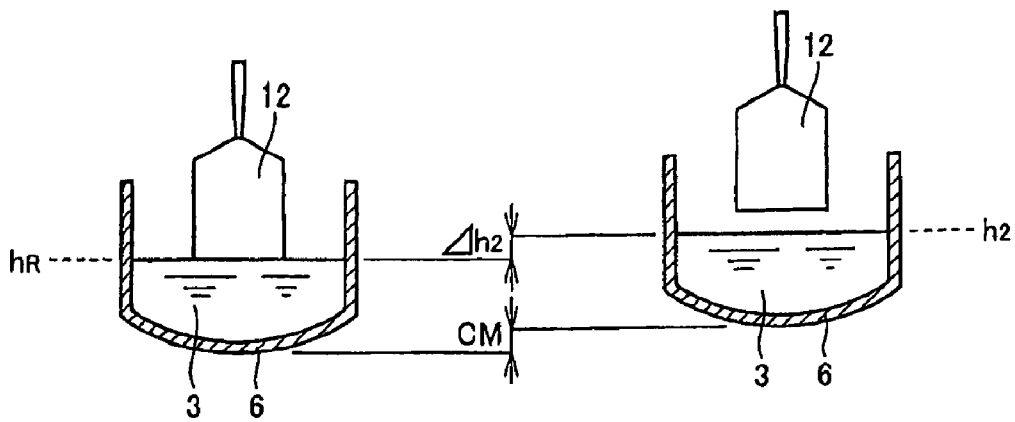

FIG.9

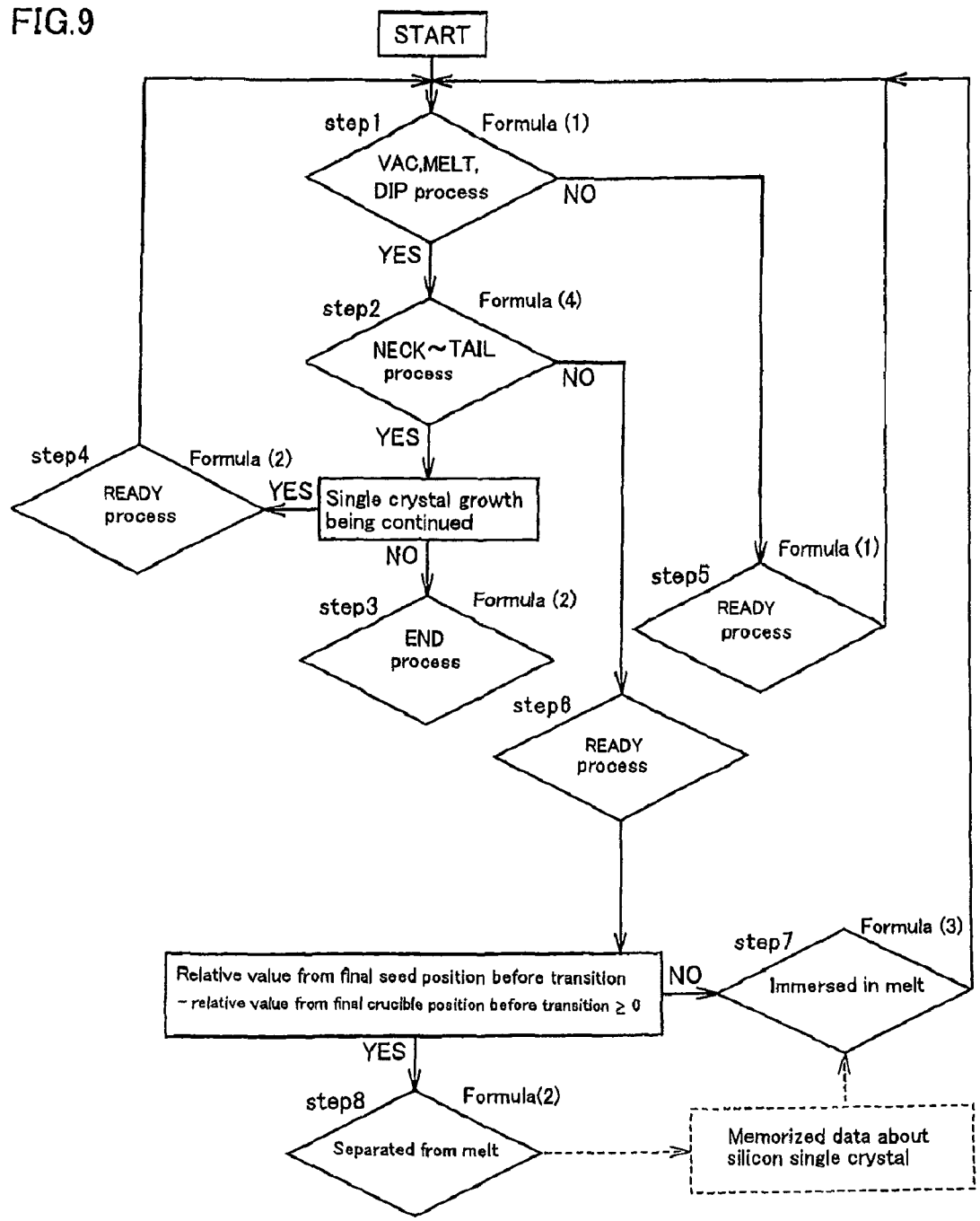

Formula (1): Estimated melt surface position = relative movig distance of crucible after seeding Formula (2): Estimated melt surface position = relative liquid surface position at time of separation from melt + relative moving distance of crucible after separation of crystal from melt Formula (3): Estimated melt surface position =

$$\text{formula (2)} + \Sigma \left\{ -\frac{GS \times SD^2 \times SM}{GL \times CD^2 - GS \times SD^2} + \frac{GL \times CD^2 \times CM}{GL \times CD^2 - GS \times SD^2} \right\}$$

Formula (4): Estimated melt surface position =

$$\text{formula (1)} + \Sigma \left\{ -\frac{GS \times SD^2 \times SM}{GL \times CD^2 - GS \times SD^2} + \frac{GL \times CD^2 \times CM}{GL \times CD^2 - GS \times SD^2} \right\}$$

MELT SURFACE POSITION MONITORING APPARATUS IN SILICON SINGLE CRYSTAL GROWTH PROCESS

FIELD OF THE INVENTION

The present invention relates to an apparatus for monitoring the melt surface position in a silicon single crystal growth process employing the Czochralski method and, more particularly to a melt surface position monitoring apparatus which makes it possible to cope with every change in liquid surface position during a period from melting raw materials for the crystal to solidification of the melt after completion of the process to prevent every predictable emergency, for example the contact of the melt with a thermal shield and a water-cooling structure or the like.

DESCRIPTION OF THE RELATED ART

Silicon single crystals currently used in manufacturing substrates for forming circuit elements such as large scale integrated circuits (LSI) are mostly pulled up by the Czochralski method (hereinafter referred to as "CZ method" for short).

In growing silicon single crystals by the CZ method, raw materials of lumpy polycrystalline silicon charged into a crucible is heated and melted by a heater disposed so as to surround the crucible. After formation of the raw-material melt in the crucible in that manner, a seed crystal (hereinafter referred to as "seed") suspended over the crucible is lowered and immersed into the raw-material melt in the crucible while rotating the crucible in a predetermined direction. While rotating said seed in a predetermined direction, the seed is pulled up, whereby an increment of cylindrical silicon single crystal sticks to and starts to grow under the seed.

FIG. 1 is a representation of the principal parts in the pulling region of a silicon single crystal growth apparatus utilizing the CZ method. The growth apparatus shown in FIG. 1 comprises a crucible 6, a heater 7 disposed to surround the crucible 6, a thermal shield 4 for mitigating the radiant heat from the crystal, and a water-cooling structure 5 for cooling the crystal and is configured such that a seed 1 may be immersed into the raw-material melt 3 formed in the crucible 6 heated by the heater and the seed then be elevated to pull up a single crystal 2.

In the silicon single crystal growth by the CZ method, the pulling rate is closely related to a temperature gradient in the silicon single crystal, and the pulling rate can be increased by increasing the temperature gradient. As shown in FIG. 1, the single crystal 2 being pulled up below the seed 1 receives the radiant heat from the high temperature members such as the heater 7 and crucible 6 in the pulling region. By providing a thermal shield 4 for inhibiting the crystal from receiving the radial heat along with the combined device with a water-cooling structure 5 through which a coolant is circulated for cooling the crystal, the above-mentioned crystal pulling rate improving effect can be enhanced.

On that occasion, such a situation that the melt 3 contained in the crucible 6 comes into contact with the thermal shield 4 and/or the water-cooling structure 5 must be avoided. For example, the contacting of the melt 3 with the water-cooling structure 5 may possibly result in a serious accident such as a steam-induced explosion and, therefore, it is necessary to control the distances from the melt 3 to the thermal shield 4 and water-cooling structure 5 at respective constant levels.

For avoiding such a situation, Japanese published examined application H04-44215 discloses a method of melt surface level measurement in a silicon single crystal growth apparatus which comprises setting a reference point at part of the thermal shield member disposed so as to surround the peripheral surface of the silicon single crystal in a pulling region, collecting signals about said reference point and a reflection image of the reference point on the melt surface by means of a linear sensor, the signals being emitted according to the intensities of light, and determining the surface level of the melt based on the size of the interval between the reference point and the reflection image on the linear sensor.

In this way, the distance between the melt surface level in the crucible and the thermal shield has been controlled in the prior art. However, the prior art monitoring and control of the melt surface are limited to the process during which fusion rings are formed in the boundary regions either between the peripheral surface of the seed and the melt surface or between the peripheral surface of the silicon single crystal under being pulled up and the melt surface, namely the process for growing a neck, shoulder, cylindrical body and tail portions of the silicon single crystal.

Thus, in the prior art growing apparatus, no monitoring or the like of the melt surface position is done in (1) the process of melting the raw materials of lumpy polycrystalline silicon, (2) the process after completion of the silicon single crystal growth until sufficient solidification of the melt in the crucible, (3) the process of melting the silicon single crystal again if a defect or the like is found in the silicon single crystal during pulling up, and (4) the process after completion of growth of an arbitrary silicon single crystal until the start of growing the next silicon single crystal for growing two or more silicon single crystals per a single batch of charging raw materials.

Therefore, in the prior art controlling method and control system, it is difficult to avoid the melt contacting with the thermal shield and/or the water-cooling structure when the crucible happens to rise due to malfunctioning, for instance, in the above processes (1)-(4) or when the melt surface level happens to rise upon immersion of the silicon single crystal in the above process (3).

In this way, the prior art melt surface position monitoring and controlling is limited to the process of growing the neck, shoulder, cylindrical body and tail portions of the silicon single crystal. Therefore, there is a problem to be solved with respect to melt surface position monitoring and controlling in the silicon single crystal growing process.

FIG. 2 schematically shows the relations among the melt surface position, the position of the crucible and the site of installation of the thermal shield in growing silicon single crystals by the CZ method. FIG. 2A shows a seeding state, FIG. 2B shows a state during pulling up the silicon single crystal, and FIG. 2C shows a state that the crucible moves upward. As shown in FIG. 2A, the growth of the silicon single crystal 2 gets started upon immersing the seed 1 into the melt 3 while the melt surface level 8 and the thermal shield 4 are maintained to have a certain constant distance between them.

With progression of the growth of the silicon single crystal 2, the melt surface position becomes lower than the melt surface position 8 at the time of seeding. In such a state of lowered melt surface position, as shown in FIG. 2B, the effect of the thermal shield 4 disposed for inhibiting the crystal from receiving the radiant heat from high-temperature parts such as the heater (not shown) and crucible 6 decreases.

Therefore, as shown in FIG. 2C, the crucible is moved upwards from the crucible position 9 at the time of seeding to thereby control the constant distance between the melt surface position 8 and thermal shield 4.

When the pulling of silicon single crystal is carried out continuously in that manner, the amount of movement of the melt surface level can be predicted, so that it is relatively easy to control the melt surface position. However, in operating using such a growth apparatus as shown in FIG. 2, it is possible that the silicon single crystal growth cannot proceed smoothly due to the generation of crystal defects, for instance. In the following, certain typical cases where the silicon single crystal growth fails to proceed smoothly are described with reference to FIGS. 3-5.

FIG. 3 schematically illustrates a case of crystal defects being detected in the stage of neck growth of silicon single crystal by the CZ method. FIG. 3A shows the state at the time of detection of crystal defects, FIG. 3B shows the state after separation of the silicon single crystal from the melt surface, and FIG. 3C shows the state resulting from immersion of the silicon single crystal into the melt for remelting.

When crystal defects are detected in the stage of growing the neck portion 10 in the actual operation, the silicon single crystal during growing is separated from the surface of the melt 3 (separation from the melt), as shown in FIG. 3B, and the silicon single crystal pulled up thus far is again immersed into the melt 3 for remelting (hereinafter, can be referred to as "insertion into the melt"). In this case, on the occasion of insertion of the silicon single crystal once pulled up into the melt, as shown in FIG. 3C, the melt surface rises to an extent corresponding to the volume of the neck portion immersed.

FIG. 4 schematically illustrates a case where crystal defects are detected in the stage of shoulder growth of silicon single crystal by the CZ method. FIG. 4A shows the state at the time of detection of the crystal defects, FIG. 4B shows the state after separation of the silicon single crystal from the melt surface, and FIG. 4C shows the state resulting from immersion of the silicon single crystal into the melt for remelting.

When crystal defects are detected in the stage of growing the shoulder portion 11, the silicon single crystal under growing is separated from the surface of the melt, as shown in FIG. 4B, and further, the silicon single crystal pulled up thus far is inserted into the melt for remelting. In this case, on the occasion of insertion of the silicon single crystal once pulled up into the melt, as shown in FIG. 4C, the melt surface rises to an extent corresponding to the volume of the shoulder portion immersed.

FIG. 5 schematically illustrates a case of crystal defects being detected in the stage of cylindrical body growth of silicon single crystal by the CZ method. FIG. 5A shows the state at the time of detection of the crystal defects, FIG. 5B shows the state after separation of the silicon single crystal from the melt surface, and FIG. 5C shows the state resulting from immersion of the silicon single crystal into the melt for remelting.

When crystal defects are detected in the stage of growing the cylindrical body portion 12, the silicon single crystal under growing is separated from the melt, like in the case of neck or shoulder growing, and further, the silicon single crystal pulled up thus far is inserted into the melt for remelting. On the occasion of insertion of the silicon single crystal pulled up thus far into the melt, as shown in FIG. 5C, the liquid surface rises to an extent corresponding to the volume of the cylindrical body portion immersed.

When crystal defects are detected during crystal growth, the same procedure as mentioned above is carried out irrespective of the state of progress of crystal growing. However, the extents of the rising of the surface of the melt 3 on the occasion of insertion of the silicon single crystal pulled up thus far into the melt for remelting vary according to which is inserted into the melt, the neck, shoulder or cylindrical body portion (FIG. 3C, FIG. 4C and FIG. 5C).

Further, in the case of growing two or more silicon single crystals per a single batch of charging raw materials, it is very difficult for the monitoring apparatus to distinguish between the pulling operation for retrieval after detecting crystal defects during silicon single crystal growth and the pulling operation for discharging after completion of silicon single crystal growth.

SUMMARY OF THE INVENTION

In case of remelting during the process of silicon single crystal growth, the monitoring of the melt surface position becomes very complicated, as mentioned above, and, therefore, it is difficult to control the melt surface level in a stereotyped manner. This is a main factor for the absence of monitoring, among others, of the melt surface position in the above-mentioned processes (1)-(4) in the prior art control systems.

The present invention, which has been made in view of the problems discussed above, has its object to provide a melt surface position monitoring apparatus making it possible to cope with every change in melt surface position in the process of silicon single crystal growth so as to prevent in advance the melt from coming into contact with the thermal shield and/or water-cooling structure, among others.

The present inventors made investigations on a melt surface position monitoring apparatus which makes it possible to prevent beforehand the melt from coming into contact with the thermal shield and/or water-cooling structure throughout the whole process of silicon single crystal growth by the CZ method, from raw-material melting to solidification of the melt after completion of silicon single crystal growth, and obtained the following findings (a) to (e).

(a) By incorporating, into the monitoring apparatus, means for memorizing the shape of the silicon single crystal during the course of pulling, it becomes possible to calculate the volume of the silicon single crystal separated from the melt and, at the same time, calculate, with high precision, the extent of rising of the melt surface on the occasion of insertion of the silicon single crystal into the melt for remelting.

(b) By dividing the whole silicon single crystal growth process into each specific growth process and selecting calculation formulas for the estimated liquid surface positions of the melt which are suited for the respective specific process, it becomes possible to calculate, with high precision, the estimated melt surface position in each specific process in reference to the melt surface position at the time of seeding.

(c) By selecting the formula for calculating the estimated liquid surface position based on the memorized shape of the silicon single crystal while seeding, in the course of growing the silicon single crystal and the silicon single crystal after completion of growth is separated from the melt, and by introducing a process (hereinafter referred to as "transition process") for calculating the estimated liquid surface position on the occasion of again inserting the seed or silicon single crystal into the melt, taking into consideration the volume of the silicon single crystal in the state separated from the melt, it becomes possible to cope with every change in melt surface position.

(d) By transmitting information about the estimated melt surface position from a controlling computer to a sequence circuit and thereby controlling the raising of the crucible, it becomes possible to keep the distance either between the melt surface and the thermal shield or between the melt and water-cooling structure at an adequate level respectively.

(e) By setting an upper limit position for the melt surface and a close position just short of the upper limit position (a quasi-upper limit position) at the time of starting the silicon single crystal growth, and providing means for setting off an alarm when the estimated melt surface position passes the quasi-upper limit position, and further by providing means for forcedly stopping the crucible from rising when the estimated melt surface position passes the critical upper limit position, it becomes possible to reliably prevent the melt from contacting with the thermal shield and/or water-cooling structure.

The present invention, which has been completed based on the above findings, consists in a melt surface position monitoring apparatus in the silicon single crystal growth process as defined in any of the following paragraphs (1) to (5).

(1) An apparatus for monitoring the surface position of the melt in the crucible in the process of silicon single crystal growth by the CZ method using the melt surface position at the time of seeding as a reference position, characterized in that it comprises means for observing the melt surface position, means for observing the position of the crucible, means for memorizing the shape of the silicon single crystal pulled up from the melt surface, means for calculating the estimated melt surface position based on the melt surface position thus observed, the position of the crucible thus observed, and the shape of the silicon single crystal thus memorized, and means for transmitting information about the estimated melt surface position to a sequence circuit at an interval of control period to control the raising or lowering of the crucible, wherein when the estimated melt surface position passes an upper limit position, the crucible is stopped from raising.

(2) A melt surface position monitoring apparatus in the process of silicon single crystal growth as set forth above under (1), characterized in that an alarm goes off when the estimated melt surface position passes the quasi-upper limit position.

(3) A melt surface position monitoring apparatus in the process of silicon single crystal growth as set forth above under (1) or (2), characterized in that as the estimated melt surface position in the vacuum evacuation process, raw material melting process and seeding process, the means for calculating the estimated melt surface position adopts the relative liquid surface position hi obtained from a formula (1) given below:

$$h_1 = DM \quad (1)$$

where $h_1$: relative liquid surface position (mm) from the reference position after seeding and
DM: moving distance (mm of the crucible after seeding.

(4) A melt surface position monitoring apparatus in the process of silicon single crystal growth as set forth above under (1) or (2), characterized in that as an estimated melt surface position of any of the neck growth process, shoulder growth process, cylindrical body growth process and tail growth process, and as that in the state of the silicon single crystal being separated from the melt after completion of the whole silicon single crystal growth process, the means for calculating the estimated melt surface position adopts, the relative liquid surface position $h_2$ obtained from a formula (2) given below:

$$h_2 = h_R + CM \quad (2)$$

where $h_2$: relative liquid surface position (mm) from the reference position in the state of the silicon single crystal being separated from the melt,
$h_R$: relative liquid surface position (mm) from the reference position at the time when the silicon single being separated from the melt, and
CM moving distance (mm) of the crucible after separation of the silicon single crystal from the melt.

(5) A melt surface position monitoring apparatus in the process of silicon single crystal growth as set forth above under (1) or (2), characterized in that as the estimated melt surface position on the occasion of immersing the silicon single crystal pulled up thus far during the course of growing into the melt for remelting in any of the neck growth process, shoulder growth process, cylindrical body growth process and tail growth process, the means for calculating the estimated melt surface position adopts the relative liquid surface position $h_3$ obtained from a formula (3) given below:

$$h_3 = h_2 + \Sigma\left\{-\frac{GS \times SD^2 \times SM}{GL \times CD^2 - GS \times SD^2} + \frac{GL \times CD^2 \times CM}{GL \times CD^2 - GS \times SD^2}\right\} \quad (3)$$

where $h_3$: relative liquid surface position (mm) from the reference position on the occasion of immersion of the silicon single crystal into the melt,
$h_2$: relative liquid surface position (mm) from the reference position in the state of the silicon single crystal being separated from the melt,
GS: specific gravity of solid silicon ($2.33 \times 10^{-3}$),
GL: specific gravity of liquid silicon ($2.53 \times 10^{-3}$),
SM: moving distance (mm) of the seed after separation of the silicon single crystal from the melt,
CM: moving distance (mm) of the crucible after separation of the silicon single crystal from the melt,
SD: diameter (mm) of the silicon single crystal pulled up from the melt surface, and
CD: diameter (mm) of the melt surface.

The "process of silicon single crystal growth" so referred to present invention means the whole process from raw-material melting to solidification of the melt after completion of the operation, including the vacuum evacuation process, raw-material melting process, seeding process, neck growth process, shoulder growth process, cylindrical body growth process and tail growth process.

The estimated melt surface position to be calculated by the melt surface position monitoring apparatus of the present invention is referenced to the melt surface position on the occasion of seeding (hereinafter referred to as "reference position"). Therefore, the "relative liquid surface position" means the relative liquid surface position from the reference position.

On the other hand, the "moving distance" means the moving distance of the seed or crucible itself within the relevant measurement time. For example, the "moving distance of the crucible after separation of the silicon single crystal from the melt" means the moving distance of the crucible itself after separation of the silicon single crystal from the melt until the time of measurement of the position of the crucible. In this case, the position of the crucible on the occasion of separating the silicon single crystal from the melt is employed as a reference and the upward movement is denoted by the sign (+) and the downward movement by the sign (−).

The "quasi-upper limit position" is the position preset between the reference position and the lower end of the thermal shield and means the marginal position of the region within which safe operations can be secured.

The "upper limit position" is the position preset between the lower end of the thermal shield and the lower end of the water-cooling structure and means the marginal position of the region within which the crucible is required to be stopped from raising.

By using the melt surface position monitoring apparatus of the present invention, it becomes possible to calculate the estimated melt surface position in any possible situation in the process of silicon single crystal growth by the CZ method and, therefore, the distance either between the melt and the thermal shield or between the melt and water-cooling structure can be controlled with high precision.

When the estimated melt surface position passes the upper limit set in advance and approaches the thermal shield, an alarm goes off and, further, when the melt surface comes into contact with the thermal shield or approaches the water-cooling structure, an alarm goes off when in need and, at the same time, the crucible is forcedly stopped from moving and thereby a serious accident such as a steam-induced explosion due to the melt coming into contact with the coolant water can be prevented.

BRIEF DESCRIPTION OF THE DRAWINGS

FIG. 2A is a drawing illustrating the seeding state, FIG. 2B is a drawing showing the state of pulling a silicon single crystal, and FIG. 2C is a drawing showing the state of the crucible moving upwards.

FIG. 3A is a drawing schematically illustrating the state at the time of detection of crystal defects, FIG. 3B is a drawing illustrating the state after separation of the silicon single crystal from the melt surface, and FIG. 3C is a drawing illustrating the state after immersion of the silicon single crystal into the melt for remelting.

FIG. 4A is a drawing illustrating the state at the time of detection of crystal defects, FIG. 4B is a drawing illustrating the state after separation of the silicon single crystal from the melt surface, and FIG. 4C is a drawing illustrating the state after immersion of the silicon single crystal into the melt for remelting.

FIG. 5A is a drawing illustrating the state at the time of detection of crystal defects, FIG. 5B is a drawing illustrating the state after separation of the silicon single crystal from the melt surface, and FIG. 5C is a drawing illustrating the state after immersion of the silicon single crystal into the melt for remelting.

FIGS. 7A and 7B are drawings schematically showing the melt surface positions in the vacuum evacuation process, raw-material melting process and seeding process. FIG. 7A is a drawing illustrating the seeding state, and FIG. 7B is a drawing illustrating the state of the crucible moving upward after seeding.

FIGS. 8A and 8B are drawings schematically showing the state of the silicon single crystal being isolated from the melt. FIG. 8A is a drawing illustrating the state just before the silicon single crystal being isolated from the melt, and FIG. 8B is a drawing illustrating the state after separation of the silicon single crystal from the melt.

FIG. 9 is a flow chart illustrating the operations of the melt surface position monitoring apparatus of the present invention in the silicon single crystal growth process.

DETAILED DESCRIPTION OF THE PREFERRED EMBODIMENTS

Figure 1:
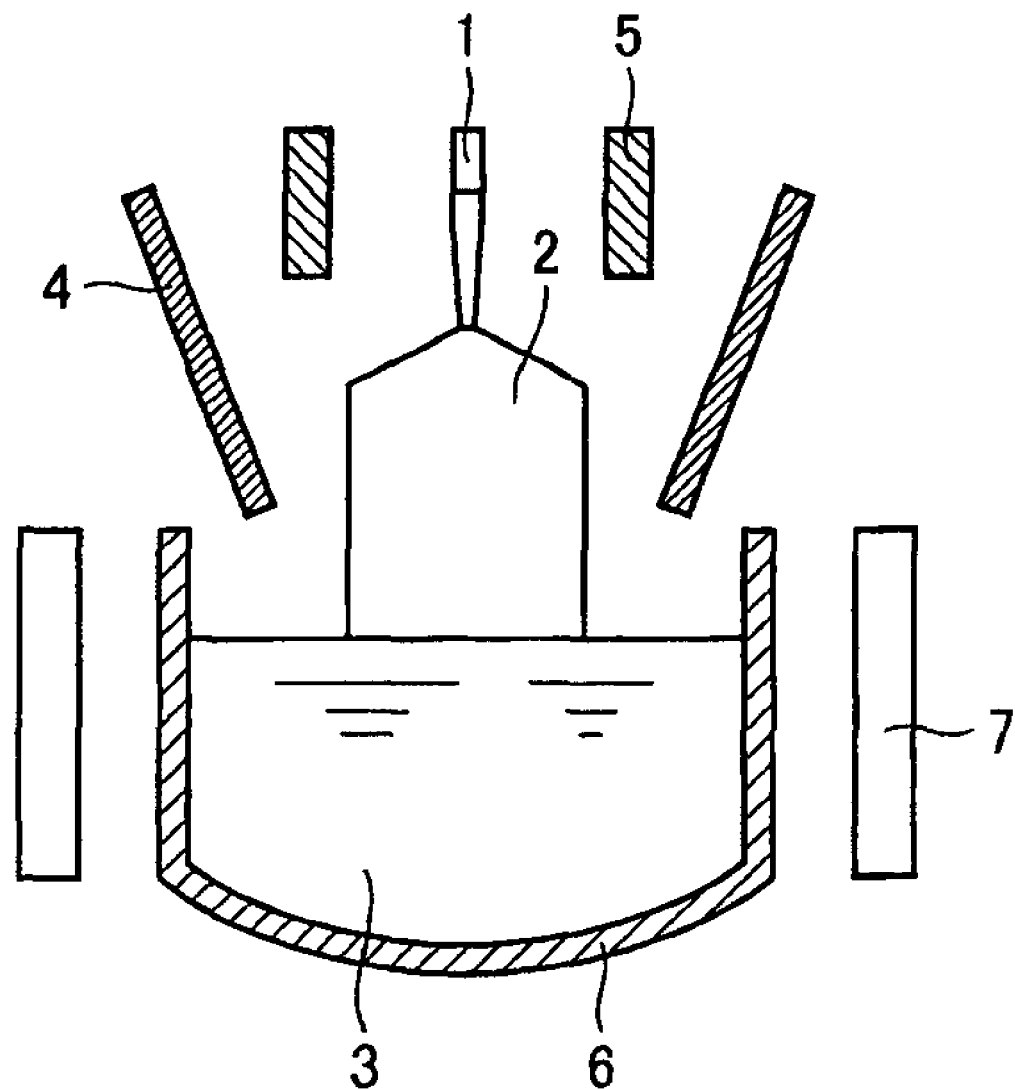
FIG. 1 is a drawing showing the main constituent parts in the pulling region of a silicon single crystal growth apparatus utilizing the CZ method.
Figure 2A:
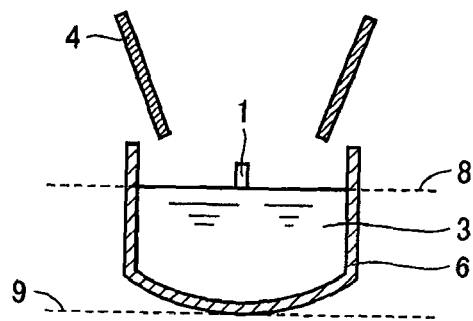
FIGS. 2A to 2C are drawings schematically showing the relations among the liquid surface position in growing silicon single crystals by the CZ method, crucible position and thermal shield member attachment site.
Figure 2B:
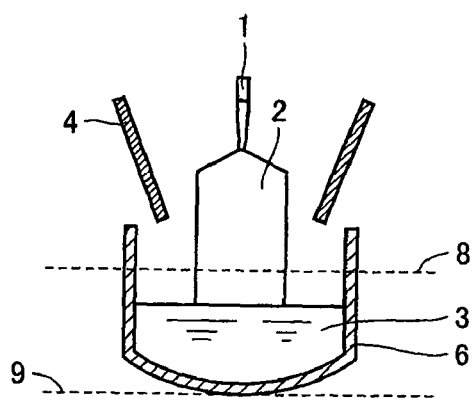
Figure 2C:
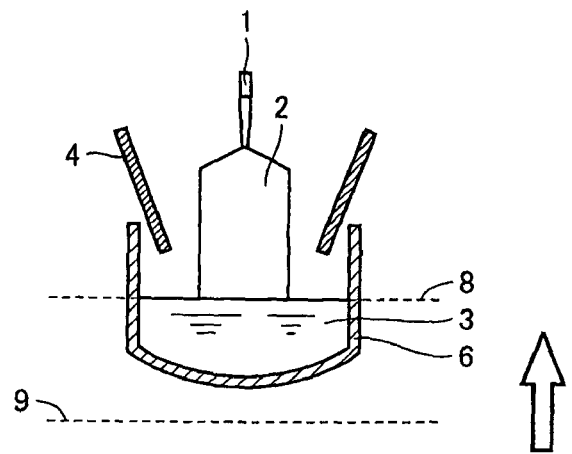
Figure 3A:
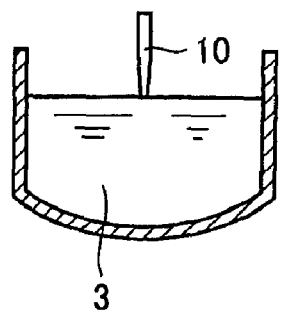
FIGS. 3A to 3C are drawings schematically showing the case where crystal defects are detected during the growth stage of silicon single crystal neck by the CZ method.
Figure 3B:
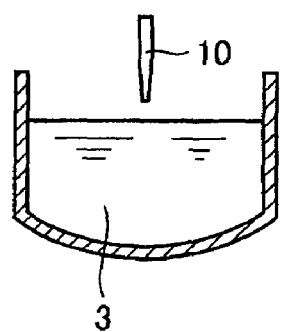
Figure 3C:
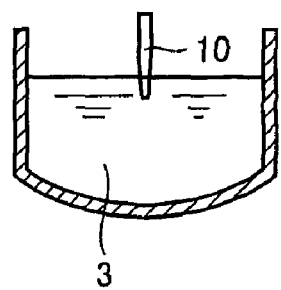
Figure 4A:
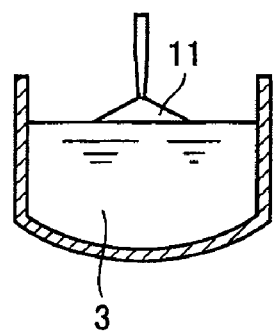
FIGS. 4A to 4C are drawings schematically showing the case where crystal defects are detected during the growth stage of silicon single crystal shoulder.
Figure 4B:
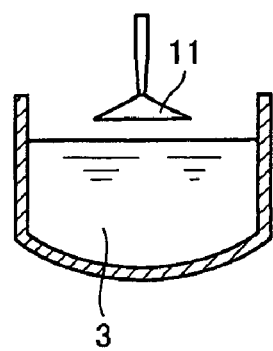
Figure 4C:
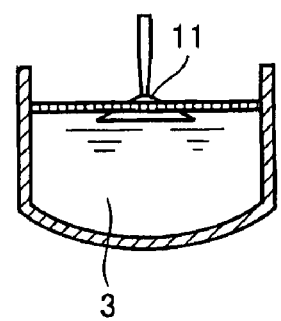
Figure 5A:
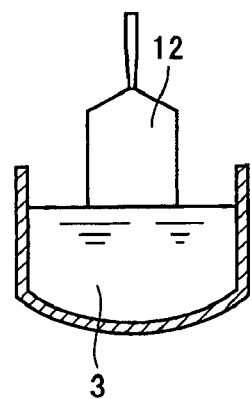
FIGS. 5A to 5C are drawings schematically showing the case where crystal defects are detected during the growth stage of silicon single crystal cylindrical body by the CZ method.
Figure 5B:
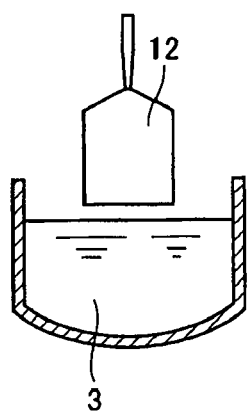
Figure 5C:
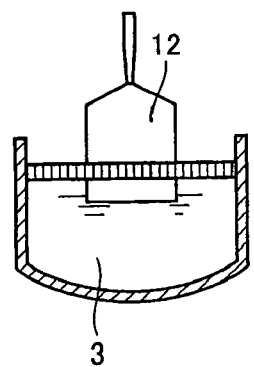

As described hereinabove, the melt surface position monitoring apparatus of the present invention, which is to be used in the silicon single crystal growth process, is characterized in that it comprises means for observing the melt surface position, means for observing the position of the crucible, means for memorizing the shape of the silicon single crystal pulled up from the melt surface, means for calculating the estimated melt surface position based on the melt surface position as observed, the position of the crucible thus observed, and the shape of the silicon single crystal thus memorized, and means for transmitting information about the estimated melt surface position to a sequence circuit at an interval of control period to control the raising or lowering of the crucible, wherein when the estimated melt surface position passes an upper limit position, an alarm goes off, if desired, and the crucible is stopped from raising. Further, it is desirable that an alarm goes off when the estimated melt surface position passes the quasi-upper limit position.

In the following, the melt surface position monitoring apparatus of the present invention in the silicon single crystal growth process is described more specifically.

The melt surface position is observed by means of a two-dimensional CCD camera disposed on the silicon single crystal growth apparatus, and the data obtained are memorized in a control computer. Like the melt surface position, the position of the crucible is also observed by means of a two-dimensional CCD camera, and the data obtained can be memorized in the control computer.

Further, the shape of the silicon single crystal pulled up from the melt surface is photographed by a two-dimensional camera, irrespective of whether the crystal is under growing or after completion of growing, and the shape data after image processing are memorized in the control computer. The volume of the silicon single crystal as calculated from the shape thus memorized serves as the basis for calculating the estimated melt surface position on the occasion of insertion of the silicon single crystal into the melt for remelting from a transition process.

Applicable as the sequence circuit for controlling the raising or lowering of the crucible based on the estimated melt surface position is, for example, a PLC (programmable logic controller). The PLC is a controller with a built-in central processing unit and storage element. It is an apparatus capable of intaking input signals via an input circuit and exerting an ON-OFF control action on an output circuit according to preset conditions to thereby freely control various output units such as solenoid valve and motors.

In the melt surface position monitoring apparatus of the present invention, an essential feature is that when the estimated melt surface position passes an upper limit position, the crucible should be stopped from raising further, in a preferred embodiment, an additional measure is taken to ensure safety so that when the estimated melt surface position passes a quasi-upper limit position, an alarm may go off. The quasi-upper limit position and upper limit position are manually set to the PLC prior to the seeding process.

Figure 6:
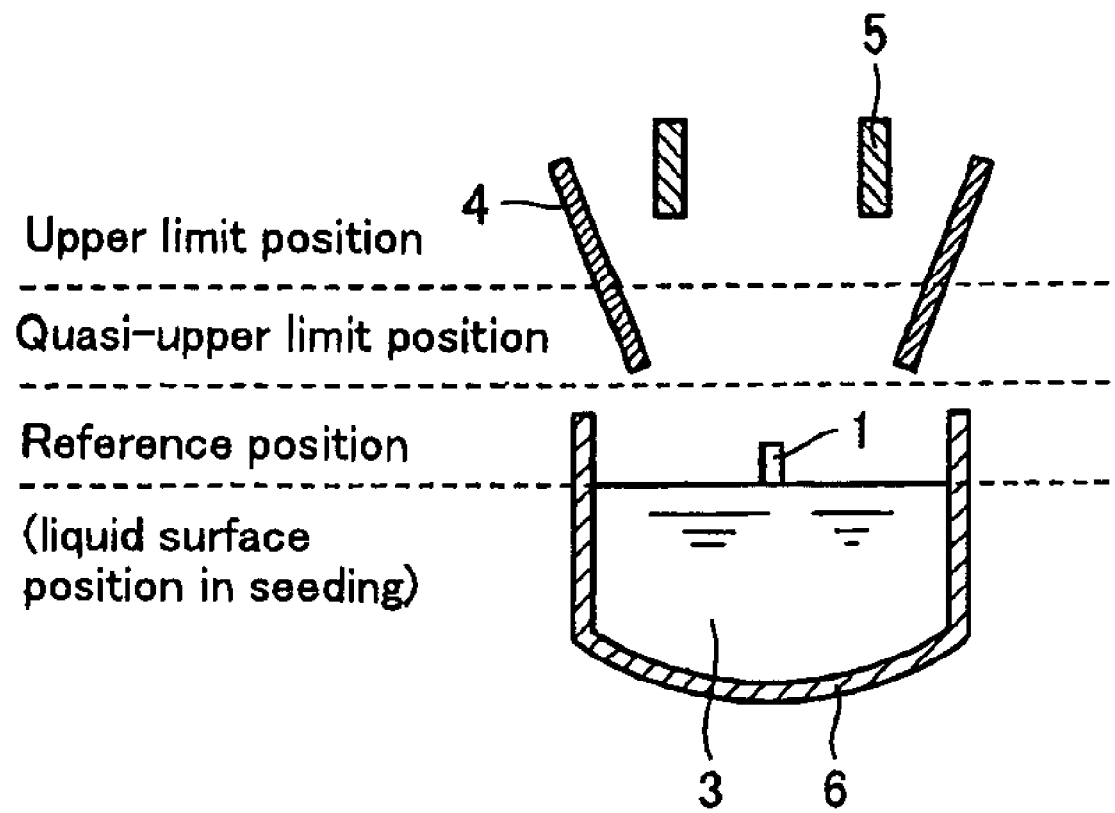
FIG. 6 is a drawing schematically illustrating the positional relationships among the melt surface position and the attachment site of the thermal shield, the quasi-upper limit position and the upper limit position in the melt surface position monitoring apparatus of the present invention in the silicon single crystal growth process.

FIG. 6 is a drawing schematically illustrating the positional relationships among the melt surface position and the attachment site of the thermal shield, the quasi-upper limit position and the upper limit position in the melt surface position monitoring apparatus of the present invention in the silicon single crystal growth process.

As shown in FIG. 6, the quasi-upper limit position is set as a level between the liquid surface position of the melt 3 on the occasion of immersion of the seed 1, namely the reference position, and the lower end of the thermal shield 4 and means an upper limit to the range within which the melt surface position is allowed to move and within which operations can be carried out safely. The upper limit position is selected between the lower end of the thermal shield 4 and the lower end of the water-cooling structure 5 and means an upper limit of the region in which the crucible must be stopped from raising; once the melt surface passes the upper limit position, the crucible 6 is forcedly stopped from moving.

As described hereinabove, in operating the melt surface position monitoring apparatus according to the present invention, the whole silicon single crystal growth process is divided into some growth process stages and formulas for calculating the estimated melt surface positions are selected for the respective process stage.

1. Evacuation Process, Raw-material Melting Process and Seeding Process

FIG. 7 schematically shows the melt surface position in the vacuum evacuation process, raw-material melting and seeding process. FIG. 7A illustrates the state just after seeding, and FIG. 7B illustrates the state of the crucible moving upwards after seeding. The reference position $h_0$ (mm) shown in FIG. 7A is the melt surface height at the time of seeding and serves as a control point(=0) for the relative liquid surface position.

When the relative liquid surface position from the reference position after seeding is designated by $h_1$ (mm) and the moving distance, after seeding, of the liquid surface from the reference position is designated by $\Delta h_1$ (mm), the following formula (4) is obtained, as illustrated in FIG. 7:

$$\Delta h_1 = h_1 - h_0 = h_1 \quad (4).$$

When the crucible 6 moves upwards after immersion of the seed 1 into the melt 3, the increase or decrease of the melt 3 in the crucible 6 can be neglected in the vacuum evacuation process, raw-material melting process and seeding process and, therefore, the following formula (5) is obtained:

$$\Delta h_1 = DM \quad (5)$$

where DM is the moving distance (mm) of the crucible after seeding.

Therefore, the following formula (1) is derived from the formulas (4) and (5) given above:

$$h_1 = DM \quad (1).$$

The above formula (1) denotes that when hi is used as the estimated melt surface position, the estimated melt surface position can be controlled solely by the moving distance of the crucible after seeding.

Further, in the vacuum evacuation process, raw-material melting process and seeding process, the increase or decrease of the melt in the crucible can be neglected, so that the above formula (1) can be applied not only when the silicon single crystal growth proceeds smoothly but also when the crystal is separated from the melt and then inserted into the melt in a transition process.

2. State of Silicon Single Crystal Isolated from Melt During Any Growth Process of Neck, Shoulder, Cylindrical Body and Tail, or the State where the Silicon Single Crystal is Isolated from the Melt After Completion of Silicon Single Crystal Growth FIG. 8 schematically shows the state of the silicon single crystal being isolated from the melt, in the cylindrical body growth process. FIG. 8A is a drawing illustrating the state just before the silicon single crystal is isolated from the melt, and FIG. 8B is a drawing illustrating the state during separation of the silicon single crystal from the melt.

When the relative liquid surface position of the silicon single crystal after separation of the silicon single crystal from the melt is designated by $h_2$ (mm), the relative liquid surface position on the occasion of release of the silicon single crystal from the melt as $h_R$ (mm), and the moving distance of the liquid surface after isolation of the silicon single crystal from the melt as $\Delta h_2$ (mm), the following formula (6) is obtained:

$$\Delta h_2 = h_2 - h_R \quad (6)$$

wherein $h_2$ and $h_R$ are the respective liquid surface positions from the reference position $h_0$ which is not shown.

Further, when the moving distance of the crucible after isolation of the silicon single crystal from the melt is designated by CM (mm), as shown in FIG. 8A and 8B, the melt 3 in the crucible does not decrease in the state of the isolation, so that the following formula (7) is obtained:

$$\Delta h_2 = CM \quad (7).$$

Therefore, from the above formulas (6) and (7), there is obtained the following formula (2):

$$H_2 = h_R + CM \quad (2)$$

The above formula (2) can be applied not only to the case where crystal defects are detected in the silicon single crystal growth stage but also to the state of the isolation of the crystal from the melt at the time of completion of the silicon single crystal growth.

3. State of Insertion of Crystal Into Melt During Any Growth Process of Neck, Shoulder, Cylindrical Body and Tail When the specific gravity of solid silicon is regarded as $GS=2.33 \times 10^{-3}$ and the specific gravity of liquid silicon as $GL=2.53 \times 10^{-3}$ and the moving distance of the seed after isolation of the silicon single crystal from the melt is taken as SM (mm), the distance of travel of the crucible after separation of the silicon single crystal from the melt as CM (mm), the diameter of the silicon single crystal withdrawn from the melt surface as SD (mm) and the diameter of the melt surface as CD (mm), the moving distance $\Delta h_3$ of the melt surface due to the growth or immersion of the silicon single crystal is represented by the following formula (8):

$$\Delta h_3 = \Sigma \left\{ -\frac{GS \times SD^2 \times SM}{GL \times CD^2 - GS \times SD^2} + \frac{GL \times CD^2 \times CM}{GL \times CD^2 - GS \times SD^2} \right\} \quad (8)$$

Since the formula (2) given above represents the relative liquid surface position from the reference position in the state of the silicon single crystal after separation from the melt, the relative liquid surface position $h_3$ (mm) from the reference position on the occasion of immersion of the silicon single crystal withdrawn from the course of growing into the melt for remelting is represented by the following formula (3) as derived from the formulas (2) and (8) given above:

$$h_3 = h_2 + \Sigma \left\{ -\frac{GS \times SD^2 \times SM}{GL \times CD^2 - GS \times SD^2} + \frac{GL \times CD^2 \times CM}{GL \times CD^2 - GS \times SD^2} \right\} \quad (3)$$

By using the above formula (3) as the estimated melt surface position on the occasion of the remelting of the silicon single crystal from the transition process, the estimated melt surface position can be calculated with high precision, irrespective of the growth stage of the silicon single crystal withdrawn.

The melt surface position monitoring apparatus of the present invention for use in the silicon single crystal growth process is to be applied to any process which has been difficult in monitoring and control by the prior art controlling methods and controlling apparatus and, accordingly, the above formula (3) is proposed herein. When, however, the silicon single crystal growth smoothly proceeds without detection of any crystal defect throughout the growth stages of silicon single crystal, the estimated melt surface position $h_3'$ can be calculated using the following formula (9) obtained by combining the formulas (1) and (8) given above:

$$h_3' = h_1 + \Sigma \left\{ -\frac{GS \times SD^2 \times SM}{GL \times CD^2 - GS \times SD^2} + \frac{GL \times CD^2 \times CM}{GL \times CD^2 - GS \times SD^2} \right\} \quad (9)$$

As described hereinabove, by selecting the formulas for calculating the estimated melt surface positions for the respective process stages, it becomes possible to calculate the estimated melt surface positions according to every possible situation in the melt surface position monitoring apparatus of the present invention for use in the silicon single crystal growth process. Consequently, the distance from the melt to the thermal shield or water-cooling structure can be controlled with high precision.

EXAMPLES

Referring to a flow chart, the operations of the melt surface position monitoring apparatus of the present invention for use in the silicon single crystal growth process utilizing the CZ method are described.

FIG. 9 is a flow chart illustrating the operations of the melt surface position monitoring apparatus of the present invention in the silicon single crystal growth process. In the branching in each process shown in FIG. 9, that the operation in question is smoothly carried out is designated by YES and that crystal defects such as dislocation is detected, is designated by NO.

In the description that follows, "END process" means a process comprising monitoring the liquid surface position for 2 hours following turning off the power supply to the heater for melting silicon and then finishing the liquid surface position monitoring operation. "READY process" has the same meaning as the transition process mentioned above and means a process comprising selecting the formula for calculating the estimated liquid surface position based on the shape of the silicon single crystal as memorized during the period when the seed or silicon single crystal is separated from the melt, irrespective of whether the process stage is in the course of silicon crystal growth or after completion of growth, and calculating the estimated melt surface position on the occasion of the insertion of the seed or silicon single crystal again into the melt, taking into consideration the volume of the silicon single crystal in a state separated from the melt.

"VAC process" means the vacuum evacuation process, "MELT process" means the raw-material melting process, and "DIP process" means the seeding process. Further, "NECK~TAIL process" means the neck growth process, shoulder growth process, cylindrical body growth process and tail growth process, inclusively.

When the silicon single crystal growth process is begun, the VAC process, MELT process and DIP process proceed in that order (step 1). On that occasion, the estimated melt surface position is calculated by the formula (1).

In case that defects are detected in the DIP process, the process shifts to the READY process and the seed is separated from the melt surface (step 5). The estimated melt surface position on the occasion of the shift and reseeding is calculated by the formula (1). At this stage where the silicon single crystal pulling up is not yet started, the position of the crucible is unchanged from the point of time of completion of melting, and the value of formula (1) is generally equal to 0. Therefore, if the crucible moves in the event of any malfunction, for instance, the process is controlled by a sequence circuit so that the value of the formula (1) may return to zero.

After completion of the DIP process, the operations of the NECK~TAIL process follow (step 2). When the silicon single crystal growth proceeds smoothly in the NECK~TAIL process (step 2), the estimated melt surface position is calculated by the formula (4). In case that the operation is finished after completion of the silicon single crystal growth, the END process follows (step 3). The END process is finished after the lapse of 2 hours subsequent to shutting off the power supply to the heater.

In the END process, the estimated melt surface position is calculated by the formula (2). The END process is a process for monitoring the solidification of the melt in the crucible and the position of the crucible basically remains unchanged from the time of detachment of the crystal from the melt, so that the value of the formula (2) is generally equal to the liquid surface position at the time of isolation of the crystal from the melt. Therefore, it is a result of movement of the crucible in the event of any malfunction, for instance, that the value of the formula (2) is unequal to the liquid surface position at the time of isolation of the crystal from the melt. In this case, the raising or lowering of the crucible is controlled by a sequence circuit so that the value of the formula (2) may return to zero.

When the silicon single crystal growth proceeds smoothly in the NECK~TAIL process and, after completion of the silicon single crystal growth, the operation is to be continued, the READY process follows (step 4). In the READY process, namely from the time of isolation of the silicon single crystal from the melt to the time of restarting of the DIP process, the estimated melt surface position is calculated by the formula (2).

On the other hand, in case that defects are detected in the silicon single crystal during growing in the NECK~TAIL process, the READY process is started (step 6). In the READY process following the NECK~TAIL process, the estimated melt surface position is calculated by the formula (2) in the case of separating the crystal from the melt (step 8) and, in the case of immersing the crystal into the melt, the estimated melt surface position is calculated by the formula (3) (step 7).

On that occasion, the monitoring apparatus is so designed that it calculates the difference between the moving distance of the seed relative to the final position of the seed before transition as the reference and the moving distance of the crucible relative to the final position of the crucible before transition as the reference and, when the difference is positive, it judges that the crystal is isolated apart from the melt and, conversely, when the difference is negative, it judges that the crystal is in the melt. Further, when the crystal is isolated apart from the melt, the shape of the silicon single crystal pulled up in the course of growing is memorized and the volume thereof is calculated so as to serve as the bases for calculation of the estimated melt surface position by the formula (3).

After completion of remelting following immersion of the silicon single crystal withdrawn in the course of growing into the melt, the DIP process is started (step 1).

In the above manner, the silicon single crystal growth process can be carried out safely owing to reliable position controlling by the melt surface position monitoring apparatus.

As described hereinabove, the melt surface position monitoring apparatus of the present invention makes it possible to calculate the estimated melt surface position according to every situation in the silicon single crystal growth process utilizing the CZ method and, consequently, control the distance between the melt and the thermal shield or water-cooling structure with high precision.

In addition, when the estimated melt surface position passes a preset upper limit and gets close to the thermal shield, an alarm goes off and, further, when the melt surface comes into contact with the thermal shield or approaches the water-cooling structure, an alarm goes off if needed and at the same time the crucible is forcedly stopped from moving, so that s a serious accident such as a steam-incurred explosion due to contact of the melt with the water-cooling structure can be prevented from occurring.

Accordingly, the apparatus can be widely applied as a melt surface position monitoring apparatus making it possible to safely operate any silicon single crystal growth apparatus utilizing the CZ method.

What is claimed is:

1. An apparatus for monitoring a liquid surface position of a melt in a crucible in the process of silicon single crystal growth by the Czochralski method using a melt surface position at the time of seeding as a reference position, which apparatus comprises:

means for observing the surface position of said melt,
means for observing the position of said crucible,
means for memorizing the shape of the silicon single crystal pulled up from the surface of said melt,
means for calculating an estimated melt surface position based on the melt surface position as observed, the position of the crucible as observed and the shape of the silicon single crystal as memorized, and
means for transmitting information about the estimated melt surface position to a sequence circuit at an interval of control period to control the raising or lowering of the crucible,
wherein, when said estimated melt surface position passes a preset upper limit position, the crucible is stopped from raising.

2. A melt surface position monitoring apparatus in the process of silicon single crystal growth as claimed in claim 1, wherein an alarm goes off when said estimated melt surface position passes a close position of just short of said upper limit position.

3. A melt surface position monitoring apparatus in the process of silicon single crystal growth as claimed in claim 1, wherein as the estimated melt surface position in the vacuum evacuation process, raw-material melting process and seeding process, said means for calculating the estimated melt surface position adopts a relative liquid surface position $h_1$ obtained from a formula (1) given below:

$$h_1 = DM \tag{1}$$

where $h_1$: relative liquid surface position (mm) from said reference position after seeding and
DM: moving distance (mm) of the crucible after seeding.

4. A melt surface position monitoring apparatus in the process of silicon single crystal growth as claimed in claim 2, wherein as the estimated melt surface position in the vacuum evacuation process, raw-material melting process and seeding process, said means for calculating the estimated melt surface position adopts a relative liquid surface position $h_1$ obtained from a formula (1) given below:

$$h_1 = DM \tag{1}$$

where $h_1$: relative liquid surface position (mm) from said reference position after seeding and
DM: moving distance (mm) of the crucible after seeding.

5. A melt surface position monitoring apparatus in the process of silicon single crystal growth as claimed in claim 1, wherein as the estimated melt surface position in the state of the silicon single crystal being separated from the melt in the neck growth process, shoulder growth process, cylindrical body growth process or tail growth process, or after completion of the whole silicon single crystal growth process, said means for calculating the estimated melt surface position adopts a relative liquid surface position $h_2$ obtained from a formula (2) given below:

$$h_2 = h_R + CM \tag{1}$$

where $h_2$: relative liquid surface position (mm) from said reference position in the state of the silicon single crystal being separated from the melt,
$h_R$: relative liquid surface position (mm) from said reference position on the occasion of separation of the silicon single from the melt, and
CM: moving distance (mm) of the crucible after separation of the silicon single crystal from the melt.

6. A melt surface position monitoring apparatus in the process of silicon single crystal growth as claimed in claim 2, wherein as the estimated melt surface position in the state of the silicon single crystal being separated from the melt in the neck growth process, shoulder growth process, cylindrical body growth process or tail growth process, or after completion of the whole silicon single crystal growth process, said means for calculating the estimated melt surface position adopts a relative liquid surface position $h_2$ obtained from a formula (2) given below:

$$h_2 = h_R + CM \tag{1}$$

where $h_2$: relative liquid surface position (mm) from said reference position in the state of the silicon single crystal being separated from the melt, $h_R$: relative liquid surface position (mm) from said reference position on the occasion of separation of the silicon single from the melt, and CM: moving distance (mm) of the crucible after separation of the silicon single crystal from the melt.

7. A melt surface position monitoring apparatus in the process of silicon single crystal growth as claimed in claim 1, wherein as the estimated melt surface position on the occasion of immersion of the silicon single crystal, pulled up in the course of growing, into the melt for remelting in the neck growth process, shoulder growth process, cylindrical body growth process or tail growth process, said means for calculating the estimated melt surface position adopts a relative liquid surface position $h_3$ obtained from a formula (3) given below:

$$h_3 = h_2 + \Sigma\left\{-\frac{GS \times SD^2 \times SM}{GL \times CD^2 - GS \times SD^2} + \frac{GL \times CD^2 \times CM}{GL \times CD^2 - GS \times SD^2}\right\} \quad (3)$$

where $h_3$: relative liquid surface position (mm) from said reference position on the occasion of immersion of the silicon single crystal into the melt, $h_2$: relative liquid surface position (mm) from said reference position in the state of the silicon single crystal being separated from the melt, GS: specific gravity of solid silicon ($2.33 \times 10^{-3}$), GL: specific gravity of liquid silicon ($2.53 \times 10^{-3}$), SM: moving distance (mm) of the seed after separation of the silicon single crystal from the melt, CM: moving distance (mm) of the crucible after separation of the silicon single crystal from the melt, SD: diameter (mm) of the silicon single crystal pulled up from the melt surface, and CD: diameter (mm) of the melt surface.

8. A melt surface position monitoring apparatus in the process of silicon single crystal growth as claimed in claim 2, wherein as the estimated melt surface position on the occasion of immersing the silicon single crystal, pulled up in the course of growing, into the melt for remelting in the neck growth process, shoulder growth process, cylindrical body growth process or tail growth process, said means for calculating the estimated melt surface position adopts a relative liquid surface position $h_3$ obtained from a formula (3) given below:

$$h_3 = h_2 + \Sigma\left\{-\frac{GS \times SD^2 \times SM}{GL \times CD^2 - GS \times SD^2} + \frac{GL \times CD^2 \times CM}{GL \times CD^2 - GS \times SD^2}\right\} \quad (3)$$

where $h_3$: relative liquid surface position (mm) from said reference position on the occasion of immersion of the silicon single crystal into the melt, $h_2$: relative liquid surface position (mm) from said reference position in the state of the silicon single crystal being separated from the melt, GS: specific gravity of solid silicon ($2.33 \times 10^{-3}$), GL: specific gravity of liquid silicon ($2.53 \times 10^{-3}$), SM: moving distance (mm) of the seed after separation of the silicon single crystal from the melt, CM: moving distance (mm) of the crucible after separation of the silicon single crystal from the melt, SD: diameter (mm) of the silicon single crystal pulled up from the melt surface, and CD: diameter (mm) of the melt surface.

* * * * *